United States Patent
Kang et al.

(10) Patent No.: US 7,768,823 B2
(45) Date of Patent: Aug. 3, 2010

(54) PHASE CHANGE MEMORY DEVICE AND OPERATING METHOD THEREOF

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 82 days.

(21) Appl. No.: 12/146,522

(22) Filed: Jun. 26, 2008

(65) Prior Publication Data

US 2009/0040813 A1    Feb. 12, 2009

(30) Foreign Application Priority Data

Aug. 10, 2007   (KR) .................. 10-2007-0080671

(51) Int. Cl.
*G11C 7/00*   (2006.01)
(52) U.S. Cl. ..................... 365/163; 365/158
(58) Field of Classification Search ............ 365/163, 365/158
See application file for complete search history.

(56) References Cited

U.S. PATENT DOCUMENTS

| | | | |
|---|---|---|---|
| 6,487,113 B1 | 11/2002 | Park et al. | |
| 2007/0177432 A1* | 8/2007 | Spall et al. | 365/189.05 |
| 2007/0247940 A1* | 10/2007 | Liaw et al. | 365/208 |
| 2008/0043513 A1* | 2/2008 | Hoenigschmid et al. | 365/148 |
| 2008/0117704 A1* | 5/2008 | Happ et al. | 365/222 |

FOREIGN PATENT DOCUMENTS

JP   H17-108395   4/2005

* cited by examiner

*Primary Examiner*—Michael T Tran
(74) *Attorney, Agent, or Firm*—Ladas & Parry LLP

(57) ABSTRACT

A phase change memory device and operation is described where the phase change memory device includes a phase change resistance cell storing data corresponding to a sensed crystallization state. The phase change memory device operates by reading data of a selected phase change resistance cell when in a write mode. The data to be written is compared to the read data. If the read data is different from the data to be written, it is determined whether the data to be written is a first data. An operation writing and verifying the first data in the cell under a first operating condition when the is data to be written is the first data is then performed. After performing verification, if the read data is different from the first data, the first data is written and verified in the selected phase change resistance cell under a second operating condition.

23 Claims, 10 Drawing Sheets

PHASE CHANGE MEMORY DEVICE AND OPERATING METHOD THEREOF

CROSS-REFERENCES TO RELATED APPLICATIONS

This application is based upon and claims the benefit of priority to Korean Patent Application No. 10-2007-80671, filed on Aug. 10, 2007, the entire contents of which are incorporated herein by reference.

BACKGROUND OF THE INVENTION

The present invention relates to a phase change memory device and an operating method thereof, and more particularly, to a technology for shortening a write time of data having a set state in a write mode.

Nonvolatile memory, including magnetic memory and phase change memory (PCM), has a data processing speed similar to that of volatile Random Access Memory (RAM) and conserves data even after power is turned off.

FIGS. 1a and 1b are diagrams illustrating a conventional phase change resistor (PCR) 4.

The PCR 4 comprises a phase change material (PCM) 2 formed between a top electrode 1 and a bottom electrode 3. A high temperature is generated in the PCM 2 when a voltage and a current are transmitted causing an electric conductive state change depending on the resistance of the PCM 2.

The PCM may include AgLnSbTe. The PCM 2 includes chalcogenide having chalcogen elements (S, Se, Te) as a main ingredient, and more specifically a germanium antimonic tellurium (Ge2Sb2Te5) consisting of Ge—Sb—Te.

FIGS. 2a and 2b are diagrams illustrating a principle of the conventional PCR 4.

As shown in FIG. 2a, the PCM 2 can be crystallized when a low current less than a threshold value flows in the PCR 4. As a result, the PCM 2 is crystallized as a low resistant material.

As shown in FIG. 2b, the PCM 2 has a temperature higher than a melting point when a high current more than a threshold value flows in the PCR 4. As a result, the PCM 2 becomes amorphous as a high resistant material.

In this way, the PCR 4 is configured to store nonvolatile data which corresponds to the two resistance states. Data "1" refers to when the PCR 4 is at a low resistance state and data "0" refers to when the PCR 4 is at a high resistance state. As a result, the logic states of the two data can be stored.

FIG. 3 is a diagram illustrating a write operation of a conventional phase change resistant cell.

Heat is generated when current flows between the top electrode 1 and the bottom electrode 3 of the PCR 4 for a given period of time. As a result, the PCM 2 is changed to crystalline or amorphous state depending on a temperature given to the top electrode 1 and the bottom electrode 3.

When a low current flows for a given time, the PCM 2 changes to a crystalline state due to low temperature heating so that the PCR 4, which is a low resistor, is at a set state. On the other hand, when a high current flows for a given time, the PCM 2 changes to an amorphous state due to high temperature heating so that the PCR 4, which is a high resistor, is at a reset state. A difference between two phases is represented by an electric resistance change.

A low voltage is applied to the PCR 4 for a long time to write the set state in a write mode. Conversely, a high voltage is applied to the PCR 4 for only a short time to write the reset state in the write mode.

In the conventional phase change memory device, a new write operation is performed even though data to be written is identical to data stored in a phase change resistance cell resulting in an unnecessary write operation. In addition, the time to write data to a set state is long which increases the total write time.

SUMMARY OF THE INVENTION

Various embodiments are directed to judging whether data to be written is identical to data already stored in a phase change resistance cell in a write mode when performing a write operation in order to reduce the number of unnecessary write operations.

Various embodiments are directed to reducing a write time using a mixed operation condition of high and low voltages for writing a set state in a write mode.

Various embodiments are directed to selecting an operating condition suitable for a characteristic of each phase change resistance cell included in a cell array so that data may be normally written in all unit phase change resistance cells in a write mode.

Various embodiments are directed to driving a stable set write state to improve reliability of cells and margin of a read sensing current.

Various embodiments are directed to changing a write condition when an initial cell write characteristic is different to obtain a normal set write condition.

According to an embodiment of the present invention, an operating method of a phase change memory device including a phase change resistance cell which is configured to sense a crystallization state changed by currents so as to store a data corresponding to the crystallization state, the operating method comprising: reading a data of a selected phase change resistance cell in a write mode; comparing a data to be written with a read data; judging whether the data to be written is a first data when the read data is different from the data to be written; writing and verifying the first data in the cell under a first operating condition when the data to be written is the first data; and writing and verifying the first data in the selected phase change resistance cell under a second operating condition when the read data after verification is different from the first data.

According to an embodiment of the present invention, a phase change memory device comprising: a cell array unit including a phase change resistance cell positioned at an intersection of a word line and a bit line; and a write driving unit configured to supply a write voltage corresponding to a data to the cell array, wherein the write driving unit generates a single write voltage when the data is a first data, and generates a write voltage having a first operating condition and a write voltage having a second operating condition when the data is a second data.

DESCRIPTION OF SPECIFIC EMBODIMENTS

Figure 1A:
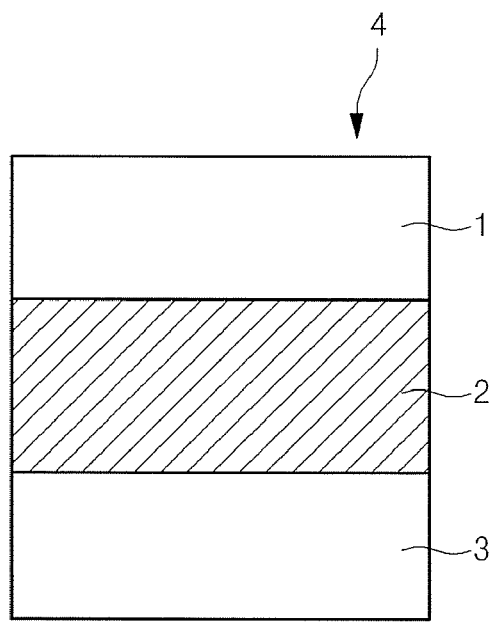
FIGS. 1a and 1b are diagrams showing a conventional phase change resistor.
Figure 1B:
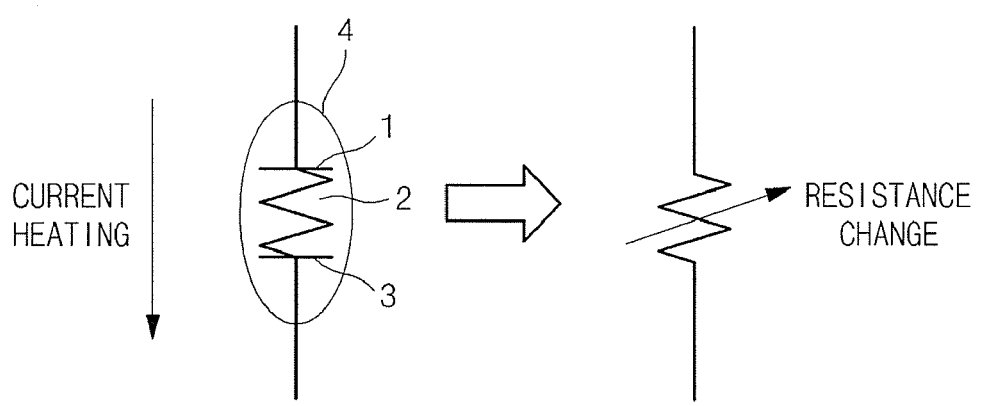
Figure 2A:
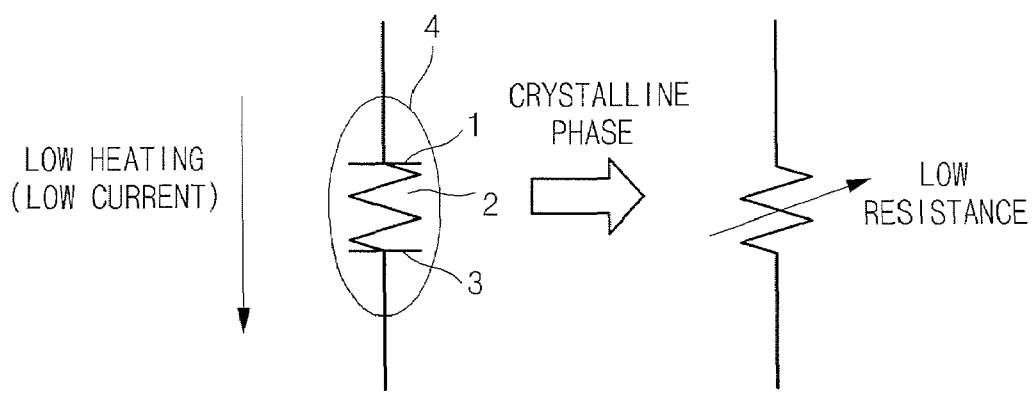
FIGS. 2a and 2b are diagrams showing a principle of the conventional phase change resistor.
Figure 2B:
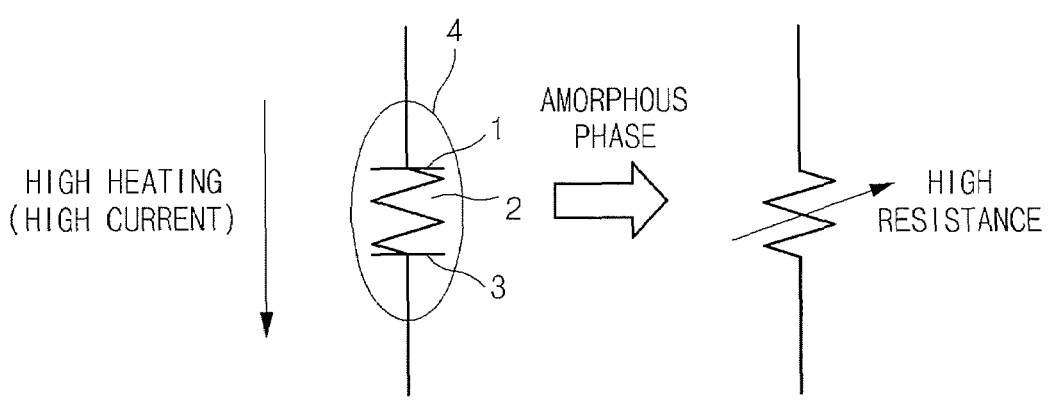
Figure 3:
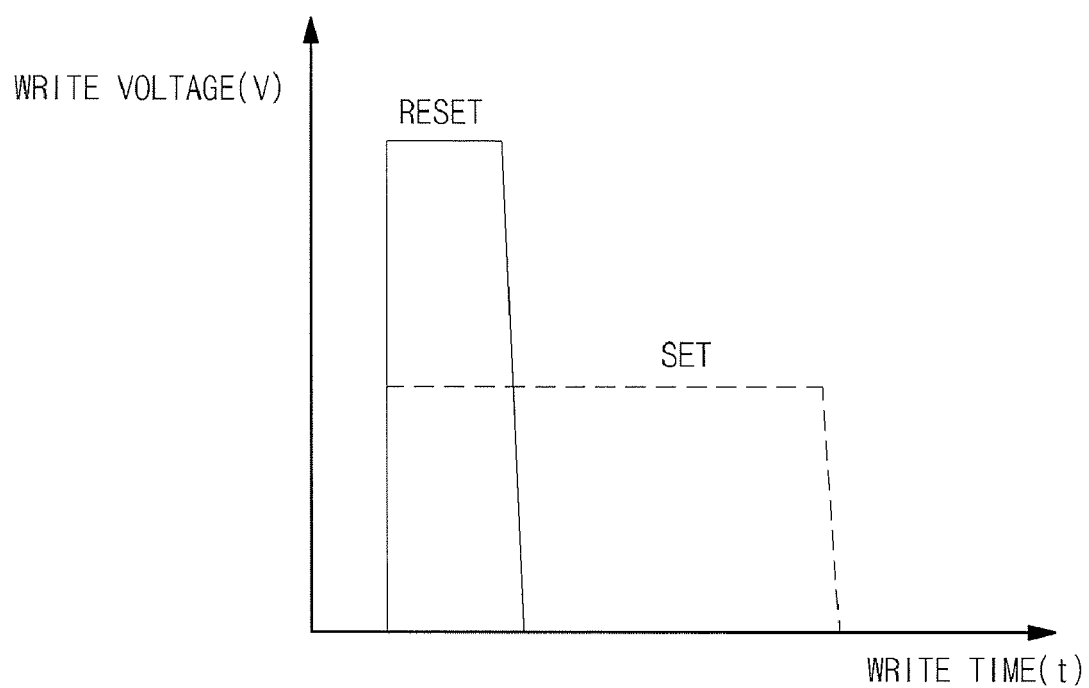
FIG. 3 is a diagram showing a write operation of a conventional phase change resistant cell.
Figure 4:
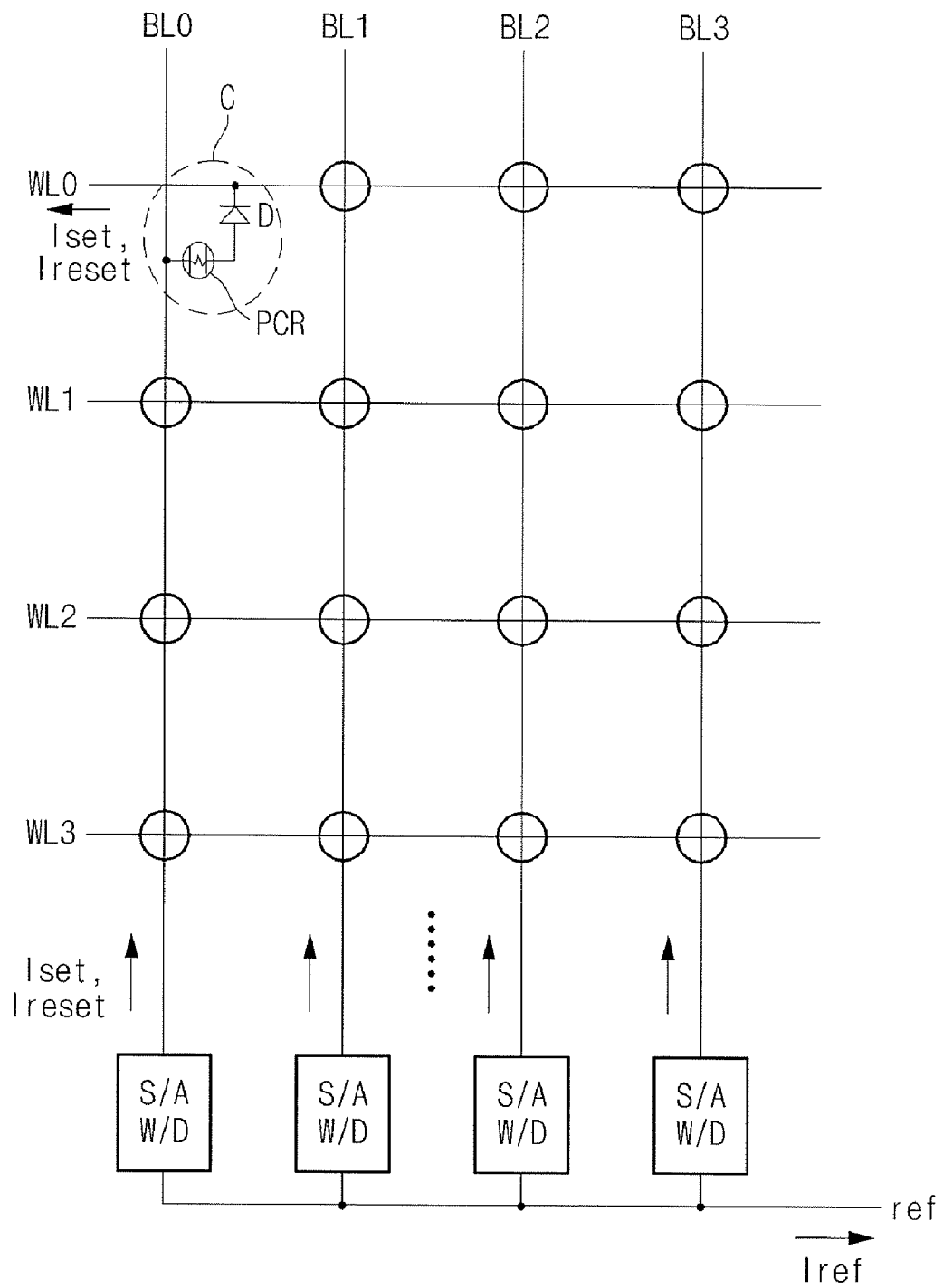
FIG. 4 is a diagram showing a cell array of a phase change memory device according to an embodiment of the present invention.

FIG. 4 is a diagram showing a cell array of a phase change memory device according to an embodiment of the present invention.

The phase change memory device includes a plurality of bit lines BL0~BL3 arranged in a column direction and a plurality of word lines WL0~WL3 arranged in a row direction. A plurality of unit phase change resistance cells C are arranged at the intersections of the bit lines BL0~BL3 and the word lines WL0~WL3. The unit phase change resistance cell C includes a phase change resistor PCR and a PN diode D.

The phase change resistor PCR has one terminal connected to the bit line BL and the other terminal connected to a P-type region of the PN diode D. The N-type region of the PN diode D is connected to the word line WL.

In the unit phase change resistance cell C, the phase change resistor PCR phase is changed according to a set current Iset and a reset current Ireset flowing in the bit line BL to write data.

The sense amplifier S/A senses cell data through the bit line BL and compares the cell data with a reference voltage ref, thereby distinguishing set data from reset data. The reference current Iref flows in a reference voltage ref receiving terminal.

A write driving unit W/D supplies a write voltage to the bit line BL corresponding to a data state when data is written to the unit phase change resistance cell C. The write driving unit W/D generates a write voltage for a set state which has a stepped pulse in a write mode and a short pulse thereafter.

Figure 5:
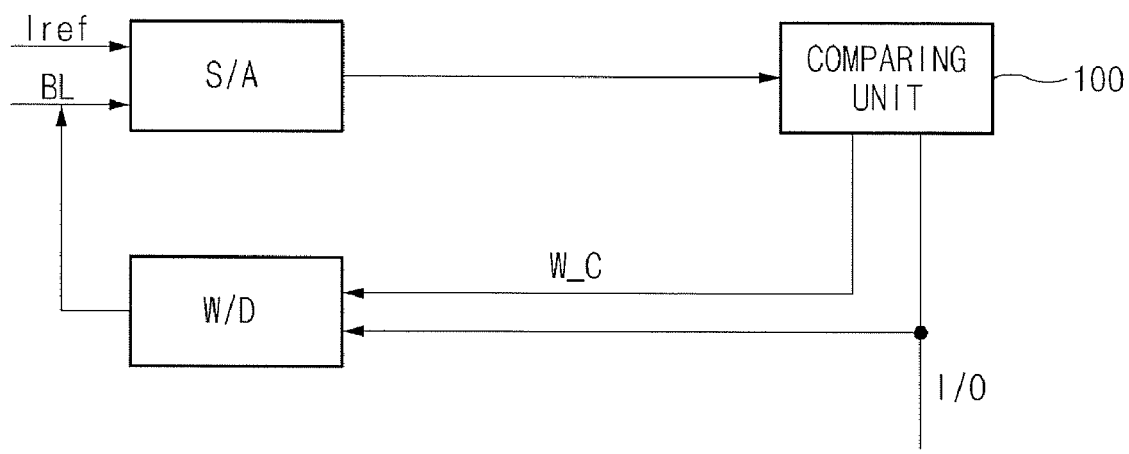
FIG. 5 is a diagram showing a sense amplifier and a write driving unit of FIG. 4.

FIG. 5 is a diagram showing the sense amplifier S/A and the write driving unit W/D of FIG. 4.

The sense amplifier S/A compares the reference current Iref with cell data received through the bit line BL. The write driving unit W/D supplies a driving voltage corresponding to a data state to the bit line BL when data is written in the cell. A comparing unit 100 compares cell read data outputted from the sense amplifier S/A with write data received from input/output lines I/O to output a write control signal W_C.

The comparing unit 100 deactivates the write control signal W_C when cell read data outputted from the sense amplifier S/A is identical to write data received from the input/output lines I/O. When the write control signal W_C is deactivated, operation of the write driving unit W/D is stopped.

The comparing unit 100 activates the write control signal to W_C when cell read data outputted from the sense amplifier S/A is different from write data received from the input/output lines I/O. When the write control signal W_C is activated, the write driving unit W/D operates and writes new data through the bit line BL.

Figure 6:
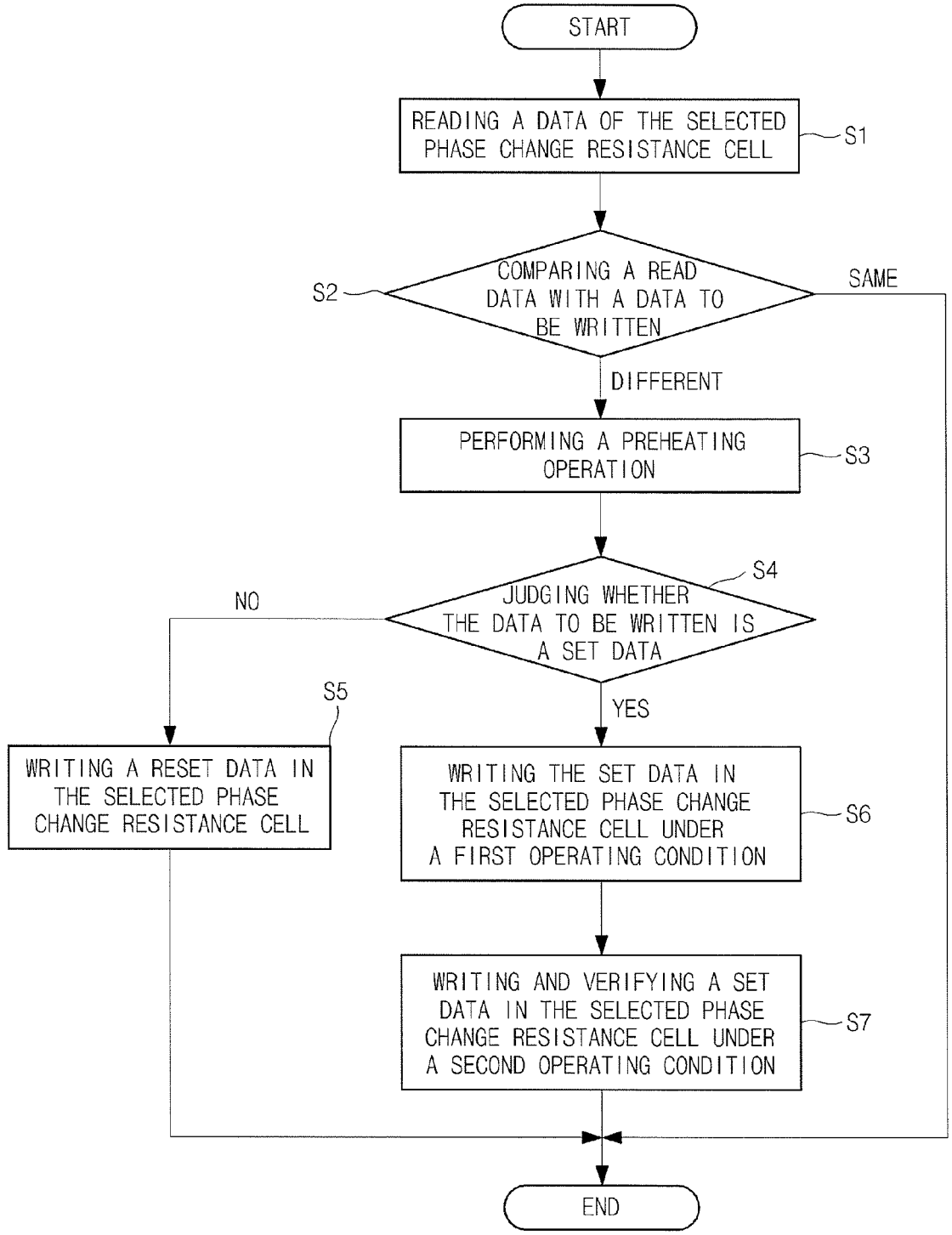
FIG. 6 is a flow chart illustrating a write cycle operation of a phase change memory device according to an embodiment of the present invention.

FIG. 6 is a flow chart illustrating a write cycle operation of a phase change memory device according to an embodiment of the present invention.

When a write cycle starts, data of the unit phase change resistance cell C selected through the sense amplifier S/A is read to judge whether the data stored in the selected unit phase change resistance cell C is set data or reset data (step S1).

The comparing unit 100 compares cell read data from the sense amplifier S/A with write data received from the input/output lines I/O to output the write control signal W_C (step S2).

The comparing unit 100 deactivates the write control signal W_C when read data from the sense amplifier S/A is identical to write data received from the input/output lines I/O. When the write control signal W_C is deactivated, operation of the write driving unit W/D is stopped.

When the data outputted from the sense amplifier S/A is identical to the write data received from the input/output lines I/O, data to be written is already stored in the cell and a new write operation is not performed. As a result, the number of reset and set write operations can be reduced.

The comparing unit 100 activates the write control signal W_C when the data outputted from the sense amplifier S/A is different from the write data received from the input/output lines I/O. When the write control signal W_C is activated, the write driving unit W/D supplies a write voltage corresponding to data in the bit line BL.

When the write control signal W_C is activated, a peak current is applied to the selected unit phase change resistance cell C to preheat the phase change resistor PCR (step S3).

Figure 7:
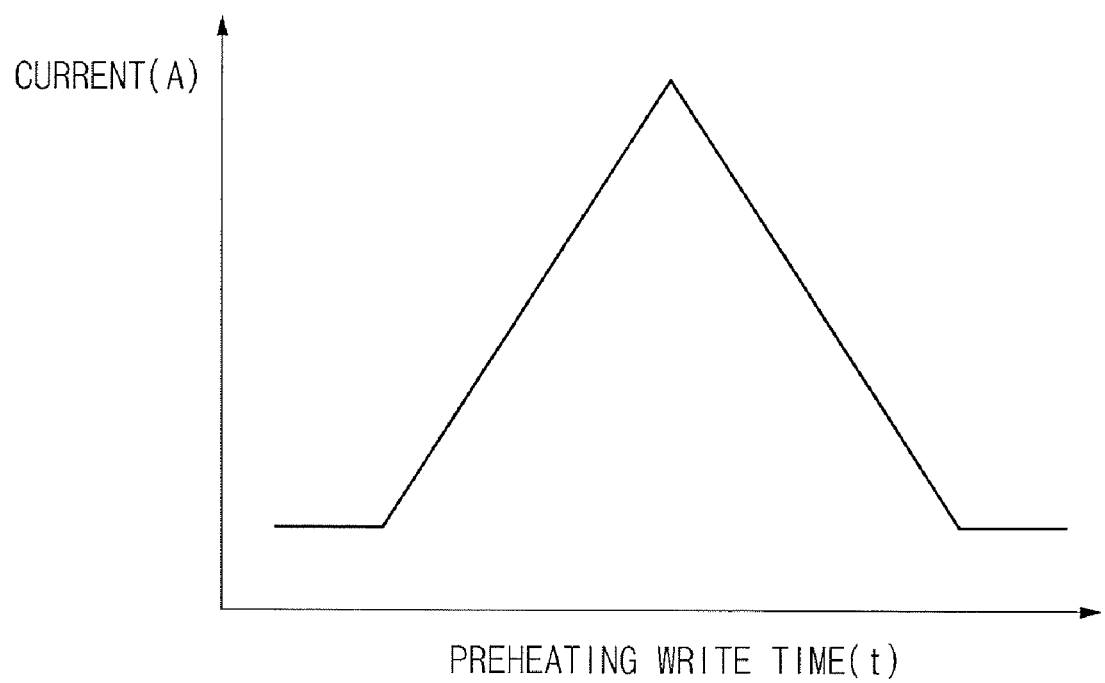
FIG. 7 is a diagram showing a preheating operation according to an embodiment of the present invention.

As shown in FIG. 7 in a preheating operation, a current having a triangle pulse type is applied to the unit phase change resistance cell C for a given time. A structured material of the phase change resistor PCR is annealed by the preheating operation so that the material is aligned to prevent binding of the structured material of the phase change resistor PCR, thereby stabilizing the device.

A read/write operation starts when the phase change resistor PCR is warmed up and not cool to maintain a constant temperature condition during a read/write cycle.

In an individual write operation, the data to be written is determined as either set data or write data (step S4).

When the data to be written is reset data, the write driving unit W/D writes new reset data to the unit phase change resistance cell C to finish the write cycle (step S5).

When the data to be written is set data, the write driving unit W/D writes new set data to the unit phase change resistance cell C according to a first operating condition (step S6).

Under the first operating condition, the phase change resistor PCR is heated to a temperature above a melting point. A write voltage for the set data is then sequentially decreased. The write voltage of the set data may have a stepped pulse type. That is, the phase change resistor PCR becomes amorphous and is gradually cooled until crystallized.

Under the first operating condition, whether the set data is written normally is verified. That is, the sense amplifier S/A reads the data stored in the unit phase change resistance cell C based on the reference current Iref.

The comparing unit 100 compares the read data from the sense amplifier S/A with the set data received from the input/output line I/O. When the read data from the sense amplifier S/A is identical to the set data received from the input/output line I/O, the write control signal W_C is deactivated. As a result, the operation of the write driving unit W/D is stopped to finish the write cycle.

When the read data from the sense amplifier S/A is different from the set data received from the input/output line I/O, new set data is written to the unit phase change resistance cell C selected by the write driving unit W/D according to a second operating condition.

Under the second operating condition, the phase change resistor PCR is heated to a temperature below the melting point. The write voltage for the set data is then sequentially decreased. The write voltage of the set data may have a short pulse type. That is, when the set data is written in the first operating condition, a partial amorphous part of the phase change resistor PCR is crystallized.

Under the second operating condition, whether the set data is written normally is verified (step S7). That is, the sense amplifier S/A reads the data stored in the unit phase change resistance cell C based on the reference current Iref. The comparing unit 100 then compares the read data from the sense amplifier S/A with the set data received from the input/output line I/O.

The second operating condition is changed until the read data from the sense amplifier S/A is identical to the set data received from the input/output line I/O thereby repeating a writing and verifying operation.

Figure 8:
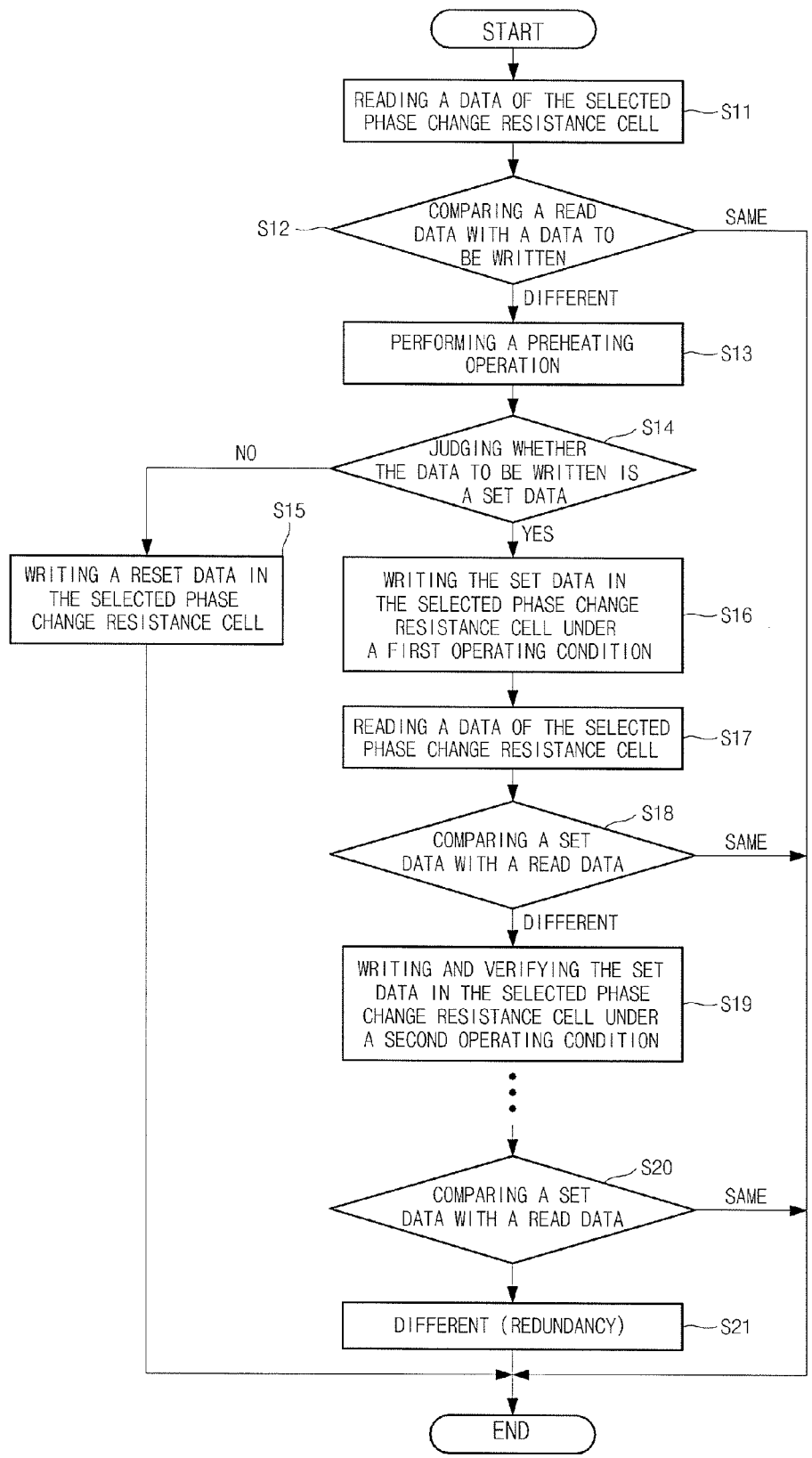
FIG. 8 is a detailed flow chart illustrating a write cycle operation of a phase change memory device according to an embodiment of the present invention.

FIG. 8 is a detailed flow chart illustrating a write cycle operation of a phase change memory device according to an embodiment of the present invention.

When a write cycle starts, data stored in the unit phase change resistance cell C is determined as either set data or reset data is. Accordingly, data of the unit phase change resistance cell C selected by the sense amplifier S/A is read (step S11).

The comparing unit 100 compares cell read data from the sense amplifier S/A to write data received from the input/output lines I/O to output the write control signal W_C (step S12).

The comparing unit 100 deactivates the write control signal W_C when read data from the sense amplifier S/A is identical to write data received from the input/output lines I/O. When the write control signal W_C is deactivated, operation of the write driving unit W/D is stopped.

The comparing unit 100 activates the write control signal W_C when the data outputted from the sense amplifier S/A is different from the write data received from the input/output lines I/O. When the write control signal W_C is activated, the write driving unit W/D supplies a write voltage corresponding to data written in the bit line BL.

When the write control signal W_C is activated, a peak current is applied to the selected unit phase change resistance cell C to preheat the phase change resistor PCR (step S13).

In an individual write operation, the data to be written is determined as either set data or write (step S14).

When the data to be written is a reset data, the write driving unit W/D writes new reset data to the unit phase change resistance cell C to finish the write cycle (step S15).

When the data to be written is set data, the write driving unit W/D writes new set data to the unit phase change resistance cell C according to a first operating condition (step S16).

Under the first operating condition, whether the set data is written normally is verified. That is, the sense amplifier S/A reads the data stored in the unit phase change resistance cell C based on the reference current Iref (step S17).

The comparing unit 100 then compares the read data from the sense amplifier S/A with the set data received from the input/output line I/O (step S18). When the read data from the sense amplifier S/A is identical to the set data received from the input/output line I/O, the write control signal W_C is deactivated. As a result, the operation of the write driving unit W/D is stopped to finish the write cycle.

When the read data from the sense amplifier S/A is different from the set data received from the input/output line I/O, new set data is written to the unit phase change resistance cell C selected by the write driving unit W/D according to the second operating condition (step S19).

Under the second operating condition, whether the set data is written normally is verified. That is, the sense amplifier S/A reads the data stored in the unit phase change resistance cell C based on the reference current Iref.

The comparing unit 100 compares the read data from the sense amplifier S/A to the set data received from the input/output line I/O. When the read data from the sense amplifier S/A is identical to the set data received from the input/output line I/O, the write control signal W_C is deactivated. As a result, operation of the write driving unit W/D is stopped to finish the write cycle.

When the read data from the sense amplifier S/A is different from the set data received from the input/output line I/O, new set data is written to the unit phase change resistance cell C selected by the write driving unit W/D according to the second operating condition.

In this way, $n^{th}$ data stored in the unit phase change resistance cell C selected by the sense amplifier S/A is read. The comparing unit 100 compares the read data to the set data (step S20).

When the read data is identical to the set data, the write cycle is finished. When the read data is different from the written data although n write operations are repeated, the unit phase change resistance cell C is repaired using a redundancy cell to finish the write cycle (step S21).

As a result, the first operating condition is applied to write the set data. When normal set data is not written by the first operating condition, the second operating condition is applied. The second operating condition is changed to write and verify the set data, thereby obtaining a set write operating condition corresponding to a characteristic of the unit phase change resistance cell C.

Previously, the phase change resistor PCR is crystallized 80~90% under the first operating condition. The remaining amorphous part of the phase change resistor PCR is trimmed under the second operating condition to completely crystallize the phase change resistor PCR and write the set data normally.

Figure 9:
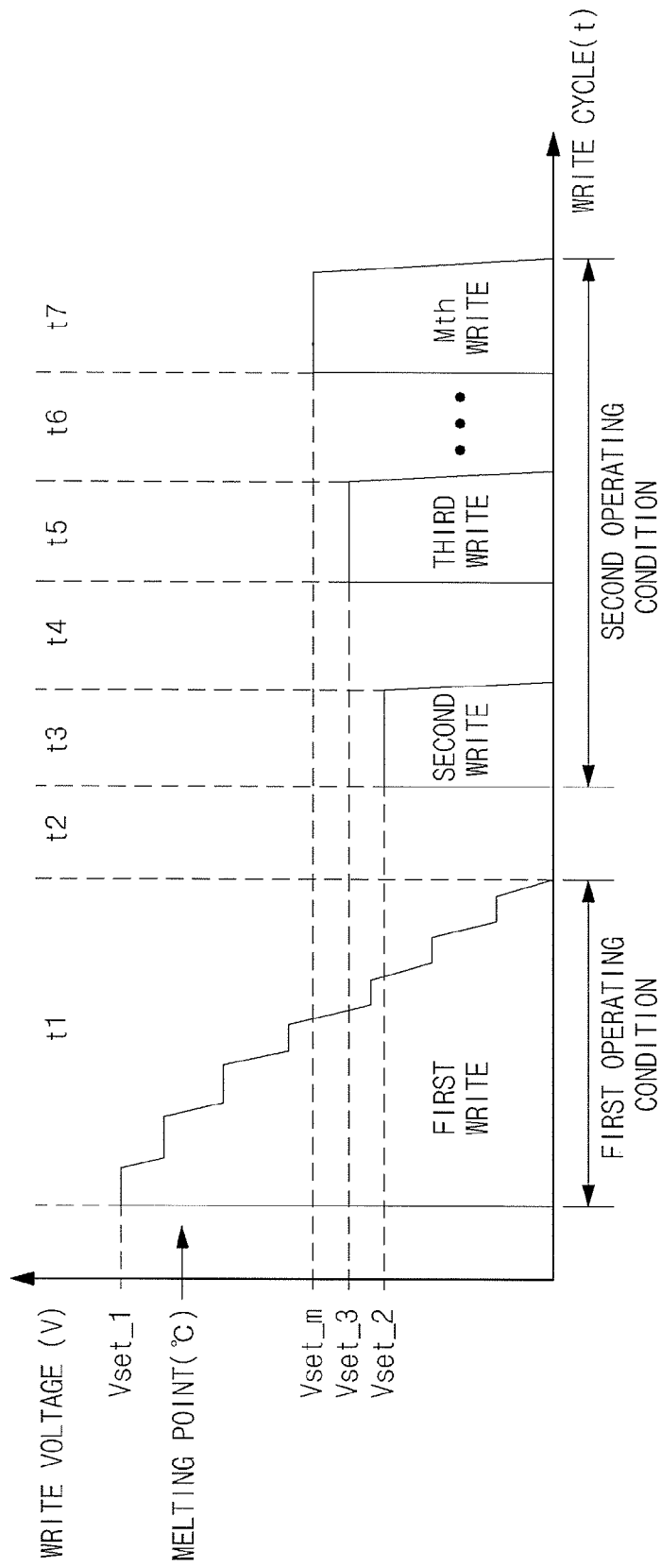
FIG. 9 is a timing diagram illustrating a write cycle operation of a phase change memory device according to an embodiment of the present invention.

FIG. 9 is a timing diagram illustrating a write cycle operation of a phase change memory device according to an embodiment of the present invention.

During a period t0, a write voltage Vset_1 of the first operating condition is applied to the unit phase change memory cell C through the write driving unit W/D. The write voltage Vset_1 has a voltage level above a melting point. The write voltage Vset_1 of the first operating condition is a stepped pulse type where the voltage level is gradually decreased during the period t1.

During a period t2, the sense amplifier S/A reads the data stored in the unit phase change memory cell C. The comparing unit 100 compares the read data to the set data. The write cycle is finished when the read data is identical to the set data. When the read data is different from the set data, a period t3 starts.

During the period t3, a first write voltage Vset_2 of the second operating condition is applied to the unit phase change memory cell C through the write driving unit W/D.

During a period t4, the sense amplifier S/A reads the data stored in the unit phase change memory cell C. The comparing unit 100 compares the read data to the set data. The write cycle is finished when the read data is identical to the set data. When the read data is different from the set data, a period t5 starts.

During the period t5, a second write voltage Vset_3 of the second operating condition is applied to the unit phase change memory cell C through the write driving unit W/D.

During a period t6, the sense amplifier S/A reads the data stored in the phase change memory cell C. The comparing unit 100 compares the read data to the set data. The write cycle is finished when the read data is identical to the set data. When the read data is different from the set data, a period t7 starts.

The second operating condition is changed to an $n^{th}$ operating condition, thereby writing and verifying the set data to obtain an operating condition that corresponds to a characteristic of the phase change resistance cell C.

The write voltage Vset_1 has a voltage level that heats the phase change resistor PCR to a temperature above a melting point and is a stepped pulse type that sequentially decreases.

A write voltage Vset_m is larger than the write voltage Vset_3 and has a voltage level that heats the phase change resistor PCR to a temperature below the melting point. The write voltage Vset_3 is larger than the write voltage Vset_2.

A set condition in the write cycle is divided into the first operating condition and the second operating condition. A set data write operation according to the first operating condition is performed first and a set data write operation according to the second operating condition is performed next.

A period of the second operating condition includes a plurality of short pulse periods. The plurality of short pulse periods includes a short pulse period for comparing the written data with the set data occurring between short pulse periods for receiving each set pulse.

Figure 10:
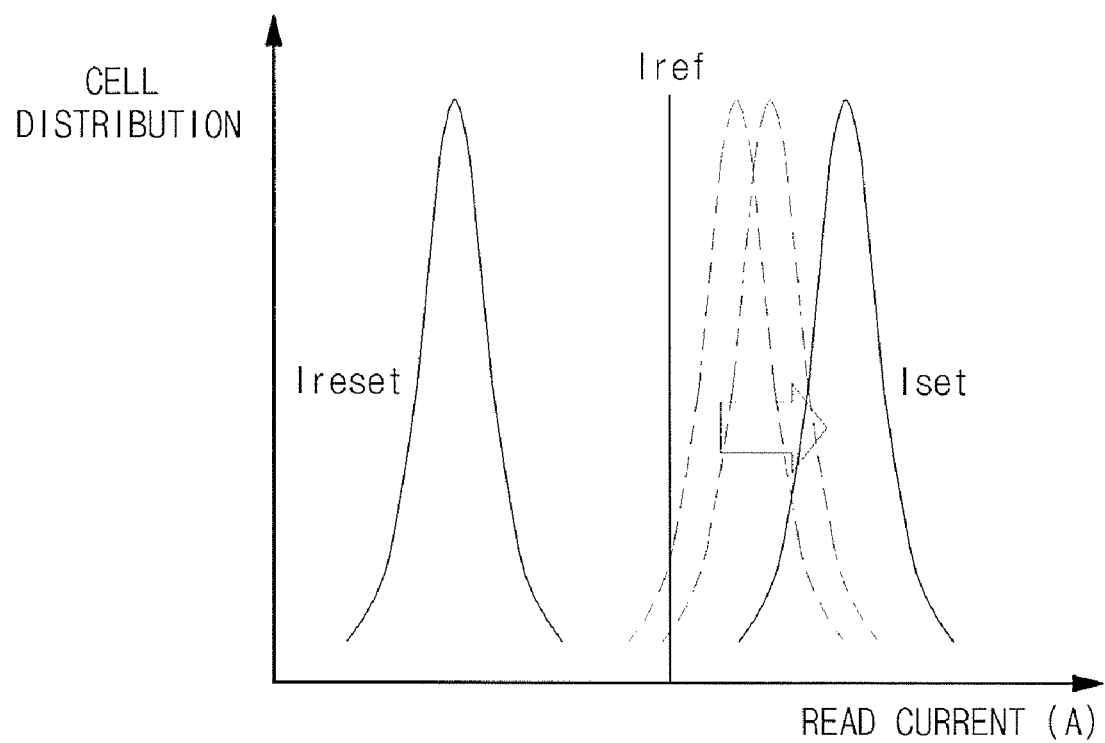
FIG. 10 is a diagram illustrating a read current relationship of a phase change memory device according to an embodiment of the present invention.

FIG. 10 is a diagram illustrating a read current relationship of a phase change memory device according to an embodiment of the present invention.

Based on the reference current Iref, the reset current Ireset has a lower current value than the reference current Iref and the set current Iset has a higher current value than the reference current Iref.

In the write mode for writing the set data, write and read operations are repeated. That is, a current value of the set current Iset is changed when a fail occurs based on the reference current Iref, so that the write and read operations to write the set data are performed normally. Operating conditions are changed according to different characteristics of each phase change resistance cell to write a set data normally in the cells.

As described above, an embodiment of the present invention determines whether data to be written is identical to data stored in a phase change resistance cell during a write mode to perform a write operation. By determining if the data to be written is identical to data already stored, the number of unnecessary write operations can be reduced.

The embodiment of the present invention reduces write time using a mixed operation condition including high and low voltages for writing a set state during a write mode.

The embodiment of the present invention selects a suitable operating condition according to a characteristic of each phase change resistance cell included in a cell array so that data may be written normally in all unit phase change resistance cells during a write mode.

The embodiment of the present invention drives a stable set write state to improve reliability of cells and a read sensing current margin.

The embodiment of the present invention changes a write condition in order to obtain a normal set write condition when a write characteristic of an initial cell changes.

As described above, a phase change memory device according to an embodiment of the present invention generates a driving voltage that corresponds to a data state at a plurality of voltage levels. The various voltages levels allow a write operation to be performed according to different characteristics of phase change resistance cells.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangement of the subject combinations within the scope of the disclosure, the drawings and the appended claims. In addition to variations and modifications in the component parts and/or arrangements, alternative uses will also be apparent to those skilled in the art.

What is claimed is:

1. An operating method of a phase change memory device including a phase change resistance cell to store a data corresponding to a sensed crystallization state changed by current, the operating method comprising the steps of:
   reading a data of a selected phase change resistance cell in a write mode;
   comparing a data to be written with the read data of the selected phase change resistance cell;
   judging whether the data to be written is a first data when the read data is different from the data to be written;
   writing and verifying the first data in the selected phase change resistance cell according to a first operating condition when the data to be written is the first data; and
   writing and verifying the first data in the selected phase change resistance cell according to a second operating condition when the read data is different from the written first data after verification.

2. The operating method according to claim 1, further comprising the step of:
   performing a preheating operation on the selected phase change resistance cell when the read data is different from the data to be written.

3. The operating method according to claim 2, wherein the preheating operation is performed by applying a current having a triangular pulse to the selected phase change resistance cell for a given time.

4. The operating method according to claim 1, wherein writing and verifying the first data is repeated until the read data is identical to the data to be written according to the second operating condition.

5. The operating method according to claim 1, wherein the first data is a set data.

6. The operating method according to claim 1, further comprising the step of:
   writing a second data in the selected phase change resistance cell when the data to be written is the second data to finish a write cycle.

7. The operating method according to claim 6, wherein the second data is a reset data.

8. The operating method according to claim 1, wherein the first operating condition applies a write voltage having a stepped pulse to the selected phase change resistance cell.

9. The operating method according to claim 8, wherein the first operating condition applies a voltage to heat a phase change resistor to a temperature above a melting point as an initial voltage of the write voltage, and decreasing the write voltage sequentially thereafter.

10. The operating method according to claim 1, wherein writing and verifying the first data in the selected phase change resistance cell according to the second operating condition comprises:
- reading a cell data stored in the selected phase change resistance cell;
- comparing the first data with the cell data; and
- writing the first data to the selected phase change resistance cell by changing the second operating condition when the cell data is different from the first data.

11. The operating method according to claim 10, wherein the second operating condition changes a write voltage applied to the selected phase change resistance cell.

12. The operating method according to claim 11, wherein the write voltage is sequentially increased.

13. The operating method according to claim 10, wherein the second operating condition applies a voltage to heat a phase change resistor to a temperature below a melting point as a write voltage.

14. The operating method according to claim 10, wherein during a write operation, reading the cell data, comparing the first data with the cell data, and writing the first data by changing the second operating condition are performed repeatedly.

15. The operating method according to claim 14, further comprising the step of:
- performing a redundancy operation after finishing the write operation when the cell data is different from the first data.

16. A phase change memory device comprising:
- a cell array unit including a phase change resistance cell positioned at an intersection of a word line and a bit line; and
- a write driving unit supplying a write voltage corresponding to a data to the cell array,
wherein the write driving unit generates a single write voltage when the data is a first data, and generates a write voltage having a first operating condition and a write voltage having a second operating condition when the data is a second data.

17. The phase change memory device according to claim 16, wherein the first data is a reset data.

18. The phase change memory device according to claim 16, wherein the second data is a set data.

19. The phase change memory device according to claim 16, wherein the write voltage having the first operating condition has a stepped pulse.

20. The phase change memory device according to claim 19, wherein the write voltage having the first operating condition has a voltage level to heat a phase change resistor to a temperature above a melting point and the voltage level sequentially decreasing thereafter.

21. The phase change memory device according to claim 16, wherein the write voltage having the second operating condition changes at a different voltage level.

22. The phase change memory device according to claim 21, wherein the write voltage having the second operating condition has a voltage level to heat a phase change resistor to a temperature below a melting point and the voltage level sequentially increasing thereafter.

23. The phase change memory device according to claim 16, wherein the phase change resistance cell comprises:
- a phase change resistor to store a data corresponding to a sensed crystallization state changed by current; and
- a diode element connected between the phase change resistor and the word line.

* * * * *